(12) United States Patent
Stewart et al.

(10) Patent No.: US 9,716,013 B2
(45) Date of Patent: Jul. 25, 2017

(54) SLOPED PHOTORESIST EDGES FOR DEFECT REDUCTION FOR METAL DRY ETCH PROCESSES

(71) Applicant: Texas Instruments Incorporated, Dallas, TX (US)

(72) Inventors: Elizabeth Costner Stewart, Dallas, TX (US); Neng Jiang, Plano, TX (US); Yung Shan Chang, Plano, TX (US); Ricky Alan Jackson, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/172,497

(22) Filed: Feb. 4, 2014

(65) Prior Publication Data

US 2015/0221524 A1 Aug. 6, 2015

(51) Int. Cl.
*H01L 21/3213* (2006.01)

(52) U.S. Cl.
CPC .. *H01L 21/32136* (2013.01); *H01L 21/32139* (2013.01)

(58) Field of Classification Search
CPC ........... H01L 21/32139; H01L 21/0337; H01L 21/31144; H01L 21/0338; H01L 21/3116

USPC ................. 438/706, 709, 713, 717
See application file for complete search history.

(56) References Cited

U.S. PATENT DOCUMENTS

| | | | |
|---|---|---|---|
| 6,054,391 A | 4/2000 | Nam et al. | |
| 6,387,774 B1* | 5/2002 | Yoo | 438/396 |
| 6,432,767 B2* | 8/2002 | Torii | 257/E21.009 |
| 6,866,976 B2* | 3/2005 | Asano et al. | 430/30 |
| 2002/0022364 A1* | 2/2002 | Hatta | H01L 21/32134 438/673 |

* cited by examiner

*Primary Examiner* — Quoc Hoang
(74) *Attorney, Agent, or Firm* — Gregory J. Albin; Charles A. Brill; Frank D. Cimino

(57) ABSTRACT

A method of etching a metal containing layer including a metal including material includes providing a substrate including a top semiconductor surface having the metal containing layer thereon. A photoresist pattern is formed from a photoresist layer on the metal containing layer including forming sloped edge regions of the photoresist layer, wherein the sloped edge regions have an average angle over a full length of the sloped edge regions of from ten (10) to fifty (50) degrees. The metal containing layer is dry etched using the photoresist pattern, wherein the sloped edge regions of the photoresist layer reduce deposition and growth of an etch byproduct including the metal including material into sidewalls of the photoresist layer (metal/polymer sidewall defect) as compared to a conventional vertical (or near-vertical) edge of the photoresist layer.

14 Claims, 3 Drawing Sheets

SLOPED PHOTORESIST EDGES FOR DEFECT REDUCTION FOR METAL DRY ETCH PROCESSES

FIELD

Disclosed embodiments relate to methods for manufacturing a semiconductor device, and more particularly, to a method for dry etching to form a patterned metal layer on a semiconductor device.

BACKGROUND

Integrated circuit (IC) processes include dry etching to form a plurality of metal layers. In one particularly process, a platinum (Pt) layer is defined to provide a pair of electrodes, such as for certain Microelectromechanical systems (MEMS) devices. Pt is generally ion milled or wet etched, but this is either expensive and/or difficult to control. Alternatively Pt can be dry etched, such as by a plasma etch, using a photoresist mask and an etch gas such as $Ar/Cl_2$, $Cl_2/BCl_3$ or $Cl_2/HBr$.

During Pt dry etch, a Pt-containing sidewall polymer defect (metal within the polymer, referred to herein as a metal/polymer sidewall defect) can grow on the edges of the photoresist-protected Pt film and remain at the photoresist edge after photoresist strip. Due to its mixed composition, this metal/polymer sidewall defect is known to be difficult to remove. Known solutions to remove the metal/polymer sidewall defect are wet chemical strip, ashing, and plasma-etching.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments describe process flows including sloping the photoresist to produce sloped edges during exposure through techniques such as defocus, bake, or a grayscale mask to reduce (or eliminate) a metal/polymer sidewall defect that would otherwise form during dry-etch of a metal containing layer including a metal including material. This metal/polymer defect is not removed by conventional photoresist strip processes, and thus conventionally needs an extra process step for its removal.

Disclosed sloped photoresist sidewalls have been found to help prevent the etched metal from depositing back onto the photoresist edge of the unetched metal containing layer and forming the metal/polymer sidewall defect. As used herein, "sloped edge regions" of photoresist refer to an average angle over the full length of the sloped edge region of from 10 to 50 degrees, which may be compared to conventional nearly vertical (80 to 90 degree) conventional photoresist sidewalls relative to the surface they are printed on which can be plagued by metal/polymer sidewall defects.

BRIEF DESCRIPTION OF THE DRAWINGS

Reference will now be made to the accompanying drawings, which are not necessarily drawn to scale, wherein.

DETAILED DESCRIPTION

Figure 1:
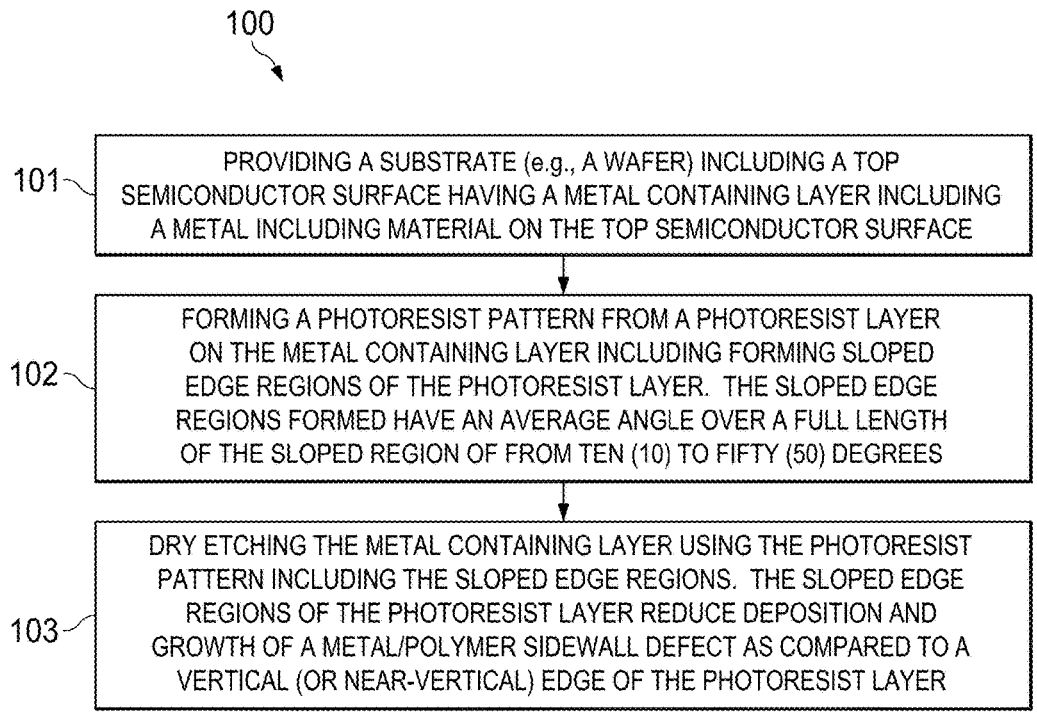
FIG. 1 is a flow chart that shows steps in an example method of etching a metal layer including a metal including material including forming sloped edge regions of the photoresist layer to avoid formation of a metal/polymer sidewall defect, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of etching a metal containing layer including a metal including material which includes the step of forming sloped edge regions of the photoresist layer, according to an example embodiment. Step 101 comprises providing a substrate including a top semiconductor surface having a metal containing layer including a metal including material thereon. Silicon is one particular example semiconductor surface. There is generally one or more intervening layers between the top semiconductor surface and the metal containing layer, such as one or more dielectric layers that comprise dielectric materials.

The metal including material can comprise an elemental noble metal (ruthenium, rhodium (Ru), palladium, silver, osmium, iridium, platinum (Pt) or gold) in one embodiment. In one particular embodiment the elemental noble metal is Pt. The metal including material can also comprise a non-noble elemental transition metal such as molybdenum. Other example metal including materials can comprise metals such as Gallium (Ga) or Lead (Pb). In addition, the metal including material can comprise metal alloys such as PbZrTi, and metal compounds including at least one non-metal such as GaN, TaN, TaAlN, TiN or RuO. Metals with relatively high atomic weight (e.g., >30 atomic mass units (amu's)) with low relative volatility generated etchant species have been found to be the most prone to metal/polymer sidewall defect formation.

Step 102 comprises forming a photoresist pattern from a photoresist layer on the metal containing layer including forming sloped edge regions. The sloped edge regions have an average angle over a full length of the sloped region of from ten (10) to fifty (50) degrees. The length range of the sloped region generally depends on the thickness of the photoresist. However, in a typical disclosed method, the thickness of the photoresist is between 3.5 μm and 7 μm, and the resulting length of the sloped region generally ranges from 3 μm to 30 μm.

The forming of sloped edge regions of photoresist layer can comprise an exposure process. For example, the exposure process can include defocus including changing a depth of focus (DOF), bake at a temperature sufficiently high to flow the photoresist, or using a grayscale mask for forming the photoresist pattern.

Step 103 comprises dry etching the metal containing layer using the photoresist pattern. The sloped edge regions of the photoresist layer reduce (or eliminate) deposition and growth of the metal/polymer sidewall defect as compared to conventional vertical edges of the photoresist layer. In the case the metal including material is Pt or a similar metal, the dry etching can comprise plasma etching using $Ar/Cl_2$, $Cl_2/BCl_3$ or $Cl_2/HBr$ gas.

Figure 2:
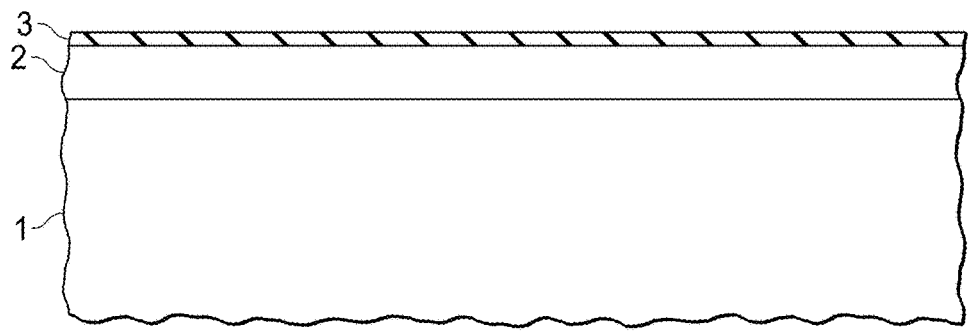
FIGS. 2-4 are cross sectional view showing steps for a disclosed method of etching a metal containing layer including a metal including material including forming sloped edge regions of the photoresist layer to avoid formation of the metal/polymer sidewall defect.
Figure 3:
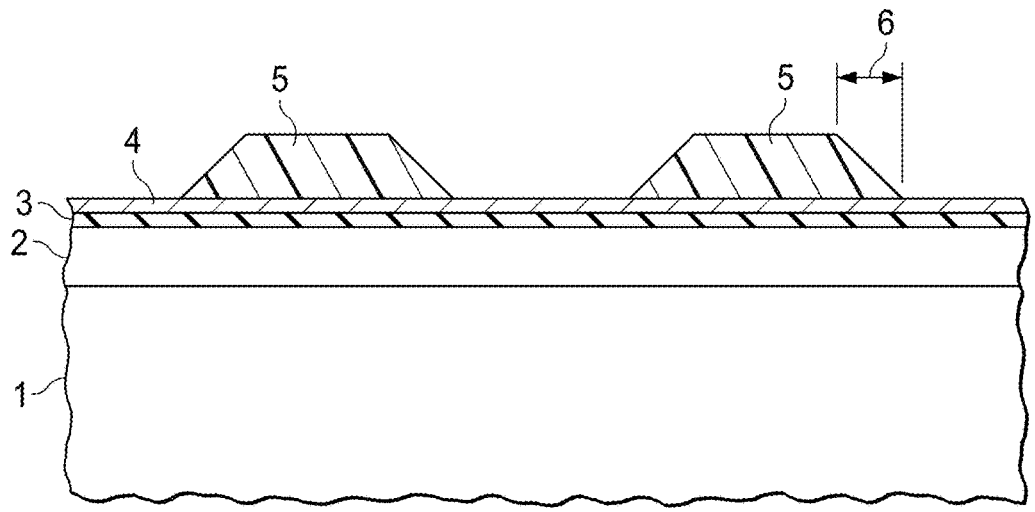

Referring to FIG. 2, a dielectric layer 3 is shown formed on a semiconductor surface 2 of a substrate 1. FIG. 3 shows a patterned photoresist layer 5 on a metal containing layer 4 on the dielectric layer 3 after patterning of a blanket photoresist layer. The patterned photoresist layer 5 can generally comprise a positive photoresist or a negative photoresist. Negative photoresist with a grayscale mask process may cause complications, such as needing to expose from the backside of the wafer. However, a bake to flow the negative photoresist or a defocus during exposure can be used to create the desired sidewall slope for negative photoresists. One of the sloped edge regions is shown as 6, which is depicted as having an average angle of about 45 degrees.

Figure 4:
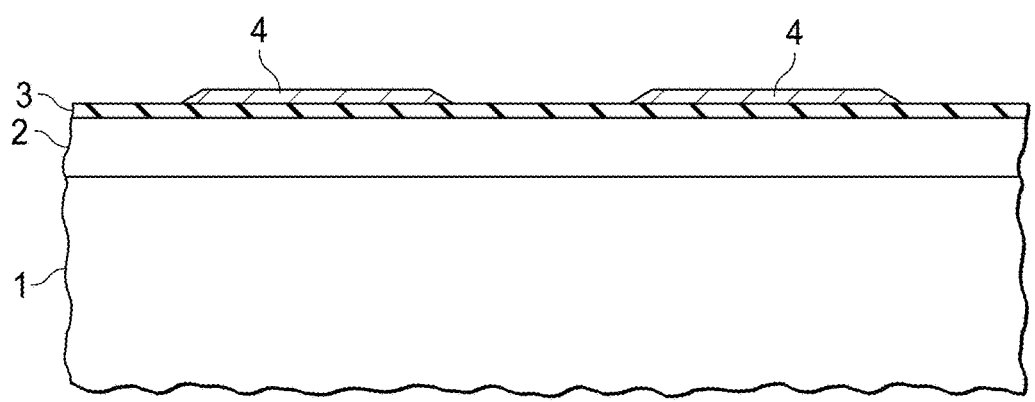

Referring to FIG. 4, using the patterned photoresist layer 5 having sloped edge regions 6 is used as an etch mask, the metal containing layer 4 is dry etched to form the metal pattern shown after photoresist pattern removal, such as using $O_2$ plasma etching or a wet removal. No metal/polymer sidewall defect is generally formed due to ions during dry etching providing in-situ removal of any redeposited metal ions (see FIG. 5B described below). In contrast, when the metal containing layer 4 is etched with conventional vertical photoresist sidewalls, etched metal or other metal atoms (e.g., Pt atoms) are redeposited on the sidewalls of the photoresist so that a metal/polymer sidewall defect is formed (see FIG. 5A described below), requiring at least one extra etch step to remove the metal/polymer sidewall defect.

The dry etch may also comprise focused ion beam (FIB) milling provided by FIB systems that have been produced commercially for approximately twenty years, primarily for large semiconductor manufacturers. FIB systems operate in a similar fashion to a scanning electron microscope (SEM) except, rather than a beam of electrons and as the name implies, FIB systems use a finely focused beam of ions (usually Ga) that can be operated at low beam currents for imaging or high beam currents for site specific sputtering or milling. Electron beam milling may also be used as the dry etch method.

Advantages of disclosed embodiments include preventing metal/polymer sidewall defect formation, reduced processing time and costs by preventing the need for the additional conventional step to remove the metal/polymer sidewall defect. Wafer probe yield is also improved due the reduction in defect levels.

One particular application for disclosed embodiments is for fabricating an autofocus lens. The lens can be a Borophosphosilicate glass (BPSG) layer which is a type of silicate glass that includes additives of both boron and phosphorus, which changes focus rapidly in response to a voltage applied to a piezoelectric film sandwiched between two Pt electrodes that may be defined using disclosed methods.

EXAMPLES

Disclosed embodiments are further illustrated by the following specific Examples, which should not be construed as limiting the scope or content of this Disclosure in any way.

A Pt layer about 100 nm thick was formed on a BPSG layer that was provided on a first silicon substrate and a second silicon substrate. The photoresist layer was 5.5 µm thick and comprised positive i-line photoresist. Disclosed sloped photoresist edges were generated by defocusing on one substrate, while the other substrate (control) had conventional photoresist pattern processing leading to conventional vertical photoresist edges. The Pt layer was plasma dry etched using a LAM9600TCP system (Lam Research Corporation, Fremont, Ca) using $BCl_3$, $Cl_2$, $O_2$, and Ar gases during the main etch; and $BCl_3$ and $Cl_2$ gases during the overetch. Photoresist removal comprised plasma ashing using the LAM9600TCP system with $O_2$. A solvent clean followed the ashing.

Figure 5A:
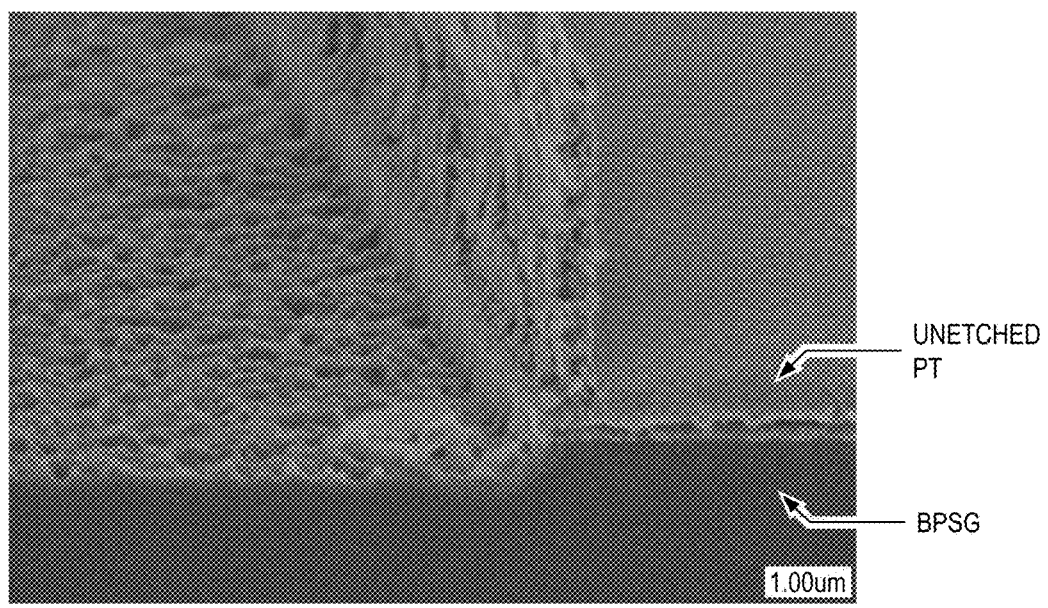
FIG. 5A is a scanned SEM depiction after Pt etch then photoresist strip showing a Pt/polymer sidewall defect at the edge of the unetched Pt film after photoresist removal when etched with conventional vertical photoresist layer edges.
Figure 5B:
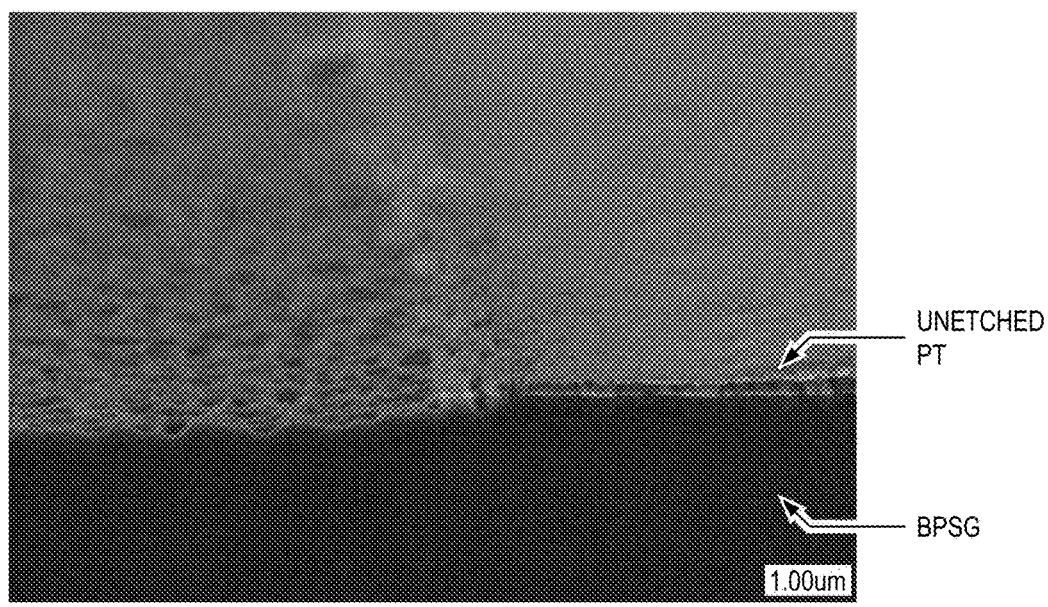
FIG. 5B a scanned SEM depiction after Pt etch then photoresist strip showing no visible polymer sidewall defect at the edge of the unetched Pt film after photoresist removal when etched with disclosed sloped edges of the photoresist layer, according to an example embodiment.

FIG. 5A is a scanned SEM depiction after Pt etch and then photoresist strip showing a nearly vertical Pt/polymer sidewall defect at the edge of the unetched Pt film after photoresist removal when etched with conventional vertical photoresist layer edges (the control). FIG. 5B a scanned SEM depiction after Pt etch and then photoresist strip showing no visible polymer sidewall defect at the edge of the unetched Pt film after photoresist removal when etched with disclosed sloped edges of the photoresist layer.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method, comprising:
   providing a substrate and a metal containing layer formed on a dielectric layer that is formed on a top semiconductor surface of said substrate;
   forming a photoresist pattern from a photoresist layer formed on said metal containing layer including forming sloped edge regions of said photoresist pattern, said sloped edge regions having an average angle over a full length of said sloped edge regions of from ten (10) to fifty (50) degrees; and
   dry etching said metal containing layer using said sloped edge regions of said photoresist pattern, wherein said sloped edge regions of said photoresist pattern reduce deposition and growth of an etch byproduct including said metal including material into sidewalls of said photoresist layer as compared to a vertical edge.

2. The method of claim 1, wherein said metal including material is an elemental metal.

3. The method of claim 2, wherein said elemental metal comprises molybdenum.

4. The method of claim 1, wherein said metal including material is an elemental noble metal.

5. The method of claim 4, wherein said elemental noble metal comprises platinum.

6. The method of claim 1, wherein said metal including material is a metal alloy.

7. The method of claim 1, wherein said metal including material is a metal compound including at least one non-metal.

8. The method of claim 1, wherein said forming said sloped edge regions of said photoresist pattern comprises an exposure process.

9. The method of claim 8, wherein said exposure process includes defocus including changing a depth of focus, baking at a temperature sufficient to flow said photoresist layer, or using a grayscale mask for said forming said photoresist pattern.

10. The method of claim 1, wherein said dry etching comprises plasma etching using $Ar/Cl_2$, $Cl_2/BCl_3$ or $Cl_2/HBr$ gas.

11. The method of claim 1, wherein said dielectric layer includes dielectric material that includes a doped glass.

12. The method of claim 11, wherein said doped glass comprises a borophosphosilicate glass (BPSG).

13. A method, comprising:
providing a substrate and a platinum (Pt) layer formed on a dielectric layer that is formed on a top semiconductor surface of the substrate;
forming a photoresist pattern from a photoresist layer formed on said Pt layer including forming sloped edge regions of said photoresist pattern, said sloped edge regions having an average angle over a full length of said sloped edge regions of from ten (10) to fifty (50) degrees; and
plasma etching said Pt layer using said sloped edge regions of said photoresist pattern, wherein said sloped edge regions of said photoresist pattern reduce deposition and growth of a Pt/polymer containing etch byproduct on sidewalls of said photoresist pattern as compared to a vertical edge.

14. The method of claim 13, wherein said dielectric material comprises borophosphosilicate glass (BPSG).

* * * * *